US007138987B2

(12) United States Patent
Nakazaki

(10) Patent No.: US 7,138,987 B2
(45) Date of Patent: Nov. 21, 2006

(54) PROTECTION CIRCUIT FOR INPUT AND OUTPUT OF LIQUID CRYSTAL DISPLAY

(75) Inventor: Yoshiaki Nakazaki, Yokohama (JP)

(73) Assignee: Kabushiki Kaisha Ekisho Sentan Gijutsu Kaihatsu Center, Yokohama (JP)

(*) Notice: Subject to any disclaimer, the term of this patent is extended or adjusted under 35 U.S.C. 154(b) by 173 days.

(21) Appl. No.: 10/401,311

(22) Filed: Mar. 26, 2003

(65) Prior Publication Data
US 2003/0184507 A1  Oct. 2, 2003

(30) Foreign Application Priority Data
Mar. 29, 2002  (JP) ............................. 2002-094476

(51) Int. Cl.
*H01L 23/62* (2006.01)
(52) U.S. Cl. ................... 345/204; 345/87; 345/205; 345/206; 257/204; 257/208; 257/355
(58) Field of Classification Search .............. 345/87, 345/204, 205, 206; 257/204, 207, 208, 355, 257/358; 361/90, 91.1, 92; 438/149, 153
See application file for complete search history.

(56) References Cited

U.S. PATENT DOCUMENTS

| | | | |
|---|---|---|---|
| 6,169,311 B1* | 1/2001 | Iwasaki | 257/358 |
| 6,194,763 B1* | 2/2001 | Hisamoto et al. | 257/353 |
| 6,329,691 B1* | 12/2001 | Finzi | 257/355 |
| 6,396,087 B1* | 5/2002 | Kitabayashi et al. | 257/207 |
| 6,441,437 B1* | 8/2002 | Gossner | 257/355 |

FOREIGN PATENT DOCUMENTS

JP   2001-209026   8/2001

* cited by examiner

*Primary Examiner*—Bipin Shalwala
*Assistant Examiner*—Vincent E. Kovalick
(74) *Attorney, Agent, or Firm*—Graybeal Jackson Haley LLP

(57) ABSTRACT

There is provided an input-output (I/O) protective circuit having more stable I/O protective function for use in the liquid crystal display device.

An IO protective circuit includes: a resistance 13 provided between an I/O terminal pad 11 and an I/O primary stage thin film transistor 12, a wiring connecting the I/O terminal pad 11 with the resistance 13, and two I/O protective thin film transistors 14 connected in series between a ground terminal 20 and a power source terminal 21. The above wiring is connected with each joint portion of the two I/O protective thin film transistors 14 and 15, each of the two I/O protective thin film transistors 14, 15 has p-type substrate potential fixing terminals 16, 18 and n-type substrate potential fixing terminals 17, 19, which are connected with each of the channel layers of the I/O protective thin film transistors 14, 15, and p-type substrate potential fixing terminals 16, 18 and n-type substrate potential fixing terminals 17, 19 are connected with the ground terminals 20.

14 Claims, 9 Drawing Sheets

21 Vdd

PRIOR ART

PRIOR ART

PROTECTION CIRCUIT FOR INPUT AND OUTPUT OF LIQUID CRYSTAL DISPLAY

CROSS-REFERENCE TO RELATED APPLICATION

Priority is claimed to Japanese patent application No. 2002-094476, filed Mar. 29, 2002, which is incorporated by reference.

BACKGROUND OF THE INVENTION

1. Field of the Invention

The present invention relates to an input-output (I/O) protective circuit for use in a liquid crystal display device, wherein an I/O primary stage thin film transistor is provided with an I/O protective function as an antistatic countermeasure against the surge current, the noise voltage and so forth.

2. Prior Art

In a liquid crystal display device (abbreviated as LCD hereinafter) including a prior art thin film transistor (abbreviated as TFT hereinafter) made of a polycrystalline silicon layer formed at a low temperature, the switching TFT set up at each pixel position, a driving circuit for the liquid crystal panel and the I/O protective circuit respectively include an n-channel lightly-doped-drain TFT (referred to as LDD MOS TFT hereinafter).

FIG. 5 is a circuit diagram showing an equivalent circuit of a prior art I/O protective circuit for LCD.

As shown in FIG. 5, the voltage supplied to opposing electrodes and others via an I/O terminal pad 41 is applied to this I/O protective circuit.

The I/O protective circuit includes an I/O protective TFT 42, an I/O resistance R1, and a resistance R2 connected between the gate G and the drain D of the I/O protective TFT 42. In the output portion of the I/O protective circuit, on one hand, there are provided an I/O primary stage TFT 43 and resistances R3, R4 and R5. The I/O protective TFT 42 and the I/O primary stage TFT 43 are a TFT having a LDD structure. The source S formed of the diffusion layer of the I/O protective TFT 42 is connected with a power source Vss. The I/O primary stage TFT 43 is a buffer giving the voltage (current) to the opposed electrodes of the liquid crystal panel, and the drain D of it is connected with the gate G via the resistance R3 as well as with the power source Vdd. The source S of the I/O primary stage TFT 43 is connected with the power source Vss via the resistance R4 as well as with the drain D of the I/O protective TFT 42 and further connected with an input circuit via the resistance R5.

The I/O protective TFT 42 and the I/O primary stage TFT 43 are not formed on a semiconductor substrate like silicon (Si) different from an ordinary semiconductor element. They are made of polycrystalline silicon and formed on a glass plate by mean of a photolithographic method. In case of the TFT for LCD, as the channel layer of the TFT is made of intrinsic semiconductor (non-doped Si), it is often seen that any potential to be referred to as a standard potential is not given to the substrate i.e. the channel layer.

However, as the circuit constitution as described above fails to make sure of a sufficient way of escape for the electric current having flowed into the I/O protective circuit, the electrostatic breakdown might be caused at the insulating film or the junction of the I/O protective TFT constituting the I/O protective circuit, thus it becoming hard for the I/O protective circuit to play its essential role. This is one problem to be solved.

The snapback phenomenon will now be explained with reference to FIGS. 6 and 7.

In the MOS TFT having a structure as shown in FIG. 6, a polycrystalline silicon layer 57 is formed on an insulating oxide film 51 and then, a gate insulating film 52 is further formed to cover the silicon film 57. Still further, the gate electrode 53 is formed on the gate insulating film 52. In the next, a predetermined impurity is doped in the polycrystalline silicon layer 57 by making use of the pattern of the gate electrode 53, thereby a drain region 54 and a source region 55 being formed and at the same time, a region between the above two regions 54 and 55 being formed as a channel region 56. In a TFT having the LDD structure like this, the source region 55 is connected with the power source Vss while the drain region 54 and the gate electrode 53 are commonly connected with each other such that a control voltage Vcnt is given to both of them.

In the next, it is studied how the current Ids flowing between the drain region 54 and the source region 55 changes in response to the change of the control voltage Vcnt which controls the voltage Vds applied between the drain region 54 and the source region 55. As a result, it is found that the relation between the voltage Vds and the current Ids changes along a solid line of a graph as shown in FIG. 7. As will be seen from the above graph, if the applied voltage Vds once exceeds the breakdown voltage (breakout voltage) BVds of the above MOS TFT, the current Ids abruptly begins to flow and can not decrease even though the applied voltage Vds is returned to the level lower than the breakdown voltage BVds. Moreover, the current Ids begins to rather increase at a still lower applied voltage Vds, that is, the secondary breakdown takes place. The phenomenon like this is called a snapback phenomenon.

In FIG. 7 showing the snapback characteristic of the MOS TFT, the voltage at a point P is called a hold voltage while the current at P is called a hold current. The snapback characteristic like this is called the bipolar action of the MOS TFT. If the impurity density difference between the drain and the substrate (i.e. channel) becomes large, the characteristic is shifted from that which is indicated by a solid line to that which is shown by a dotted line as shown in FIG. 7. In other words, the breakdown voltage BVds becomes lower and at the same time, the hold voltage becomes lower, too. The TFT of this type is herein called a non-LDD TFT.

The TFT having the high breakdown voltage BVds as well as the high hold voltage like the above-mentioned, might be most suitably used as a driving TFT for the liquid crystal display panel, but it is not suitable for using as the I/O protective TFT. On one hand, in case of the TFT as sued in LCD, as it is not possible to fix the standard potential of the substrate, the potential of the substrate can not be free from the influence of the fixed electric charge existing in the foundation film on the substrate side, the semiconductor layer, insulating gate film and so forth. Thus, the potential of the substrate is made unstable due to the above electrostatic charges, thereby the characteristic of the TFT being changed and becoming unstable. This is another problem to be solved in addition to the one as mentioned above.

As described above, however, as the prior art I/O protective circuit for LCD fails to provide a sufficient way of escape allowing the current having flowed into the I/O protective circuit to get out therefrom, it constitutes the switching element for driving each pixel of the liquid crystal panel or the I/O primary TFT by using the LDD TFT, but with regard to the I/O protective circuit, there has been not used the non-LDD TFT of which the breakdown voltage BVds and the hold voltage at the time of the snapback are lower than those of the LDD TFT, respectively.

Accordingly, the invention has been made in view of the above-mentioned problems and others and an object of the invention is to provide an I/O protective circuit for LCD having more stable I/O protective function.

SUMMARY OF THE INVENTION

In order to solve the problems as described above, the invention takes such constitutions as recited in the scope of claim for patent as attached to this specification.

The invention, in certain embodiments, relates to an input-output (I/O) protective circuit for a LCD having an I/O primary stage thin film transistor, and includes an I/O protective thin film transistor having a p-type substrate potential fixing terminal and an n-type substrate potential fixing terminal, both of which are operatively coupled to a channel layer of the I/O protective thin film transistor, wherein both of the p- and n-type substrate potential fixing terminals are connected with a ground terminal. A breakdown voltage and a hold voltage of the I/O protective thin film transistor are made, respectively, lower than those of the I/O primary stage thin film transistor or those of a thin film transistor used as a switching element for driving a pixel of the LCD device.

The invention, in certain other embodiments, relates to an (I/O) protective circuit for a LCD, and includes a resistance provided between an I/O terminal pad and an I/O primary stage thin film transistor, a wiring connecting the I/O terminal pad with the resistance, and two I/O protective thin film transistors connected in series between a ground terminal and a power source terminal, wherein the wiring is connected with each joint portion of the two I/O protective thin film transistors, each of the two I/O protective thin film transistors has a p-type substrate potential fixing terminal and an n-type substrate potential fixing terminal, both of which are connected with a channel layer of the I/O protective thin film transistor, and the p- and n-type substrate potentials fixing terminals are connected with the ground terminal. In addition, a breakdown voltage and a hold voltage of the I/O protective thin film transistors are made, respectively, lower than those of the I/O primary stage thin film transistor or those of a thin film transistor used as a switching element for driving a pixel of the LCD device.

The invention, in yet other embodiments, relates to a protective circuit for use in a LCD device connectable to an input circuit of a primary stage thin film transistor, and includes a thin film transistor having a p-type substrate potential fixing terminal and an n-type substrate potential fixing terminal operatively coupled to a channel layer, and a ground terminal operatively coupled to the p-type and the n-type substrate potential fixing terminal, wherein a breakdown voltage and a hold voltage of the protective thin film transistor are made, respectively, lower than those of the primary stage thin film transistor or those of a thin film transistor used as a switching element for driving a pixel of the LCD device.

The invention, in still other embodiments, relates to a protective circuit for use in a LCD device connectable to an input circuit of a primary stage thin film transistor, and includes first and second protective thin film transistors, each having a p-type substrate potential fixing terminal and an n-type substrate potential fixing terminal operatively coupled to a channel layer on a positive side of the circuit, and a ground terminal operatively coupled to the p-type and the n-type substrate potential fixing terminals, wherein a breakdown voltage and a hold voltage of the protective thin film transistor are made, respectively, lower than those of the primary stage thin film transistor or those of a thin film transistor used as a switching element for driving a pixel of the LCD device.

BRIEF DESCRIPTION OF THE DRAWINGS

In the drawings:

FIG. 2b is a sectional view taken on line A–A' in FIG. 2a.

FIG. 4b is a sectional view taken on line A–A' in FIG. 4a.

DETAILED DESCRIPTION OF THE PREFERRED EMBODIMENTS

Figure 1:
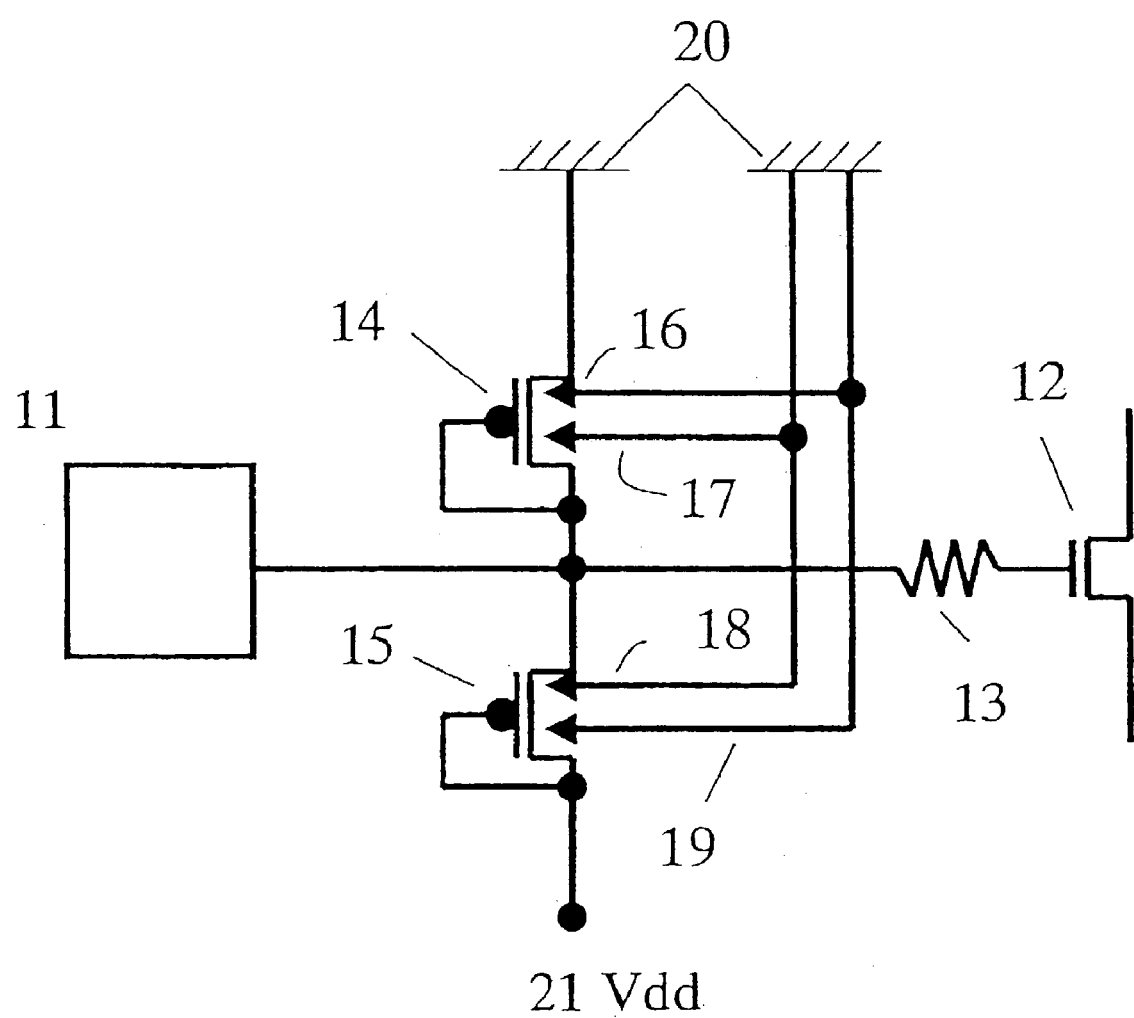
FIG. 1 is a circuit diagram of an I/O protective circuit for LCD according to the first embodiment of the invention.

An I/O protective circuit for LCD according to the invention will now be described in detail by way of some embodiments thereof with reference to the accompanying drawings in which constituents of the invention having like function are designated by like reference numerals and signs, thus repetitive description thereabout being omitted for simplification.

First Embodiment

Figure 2A:
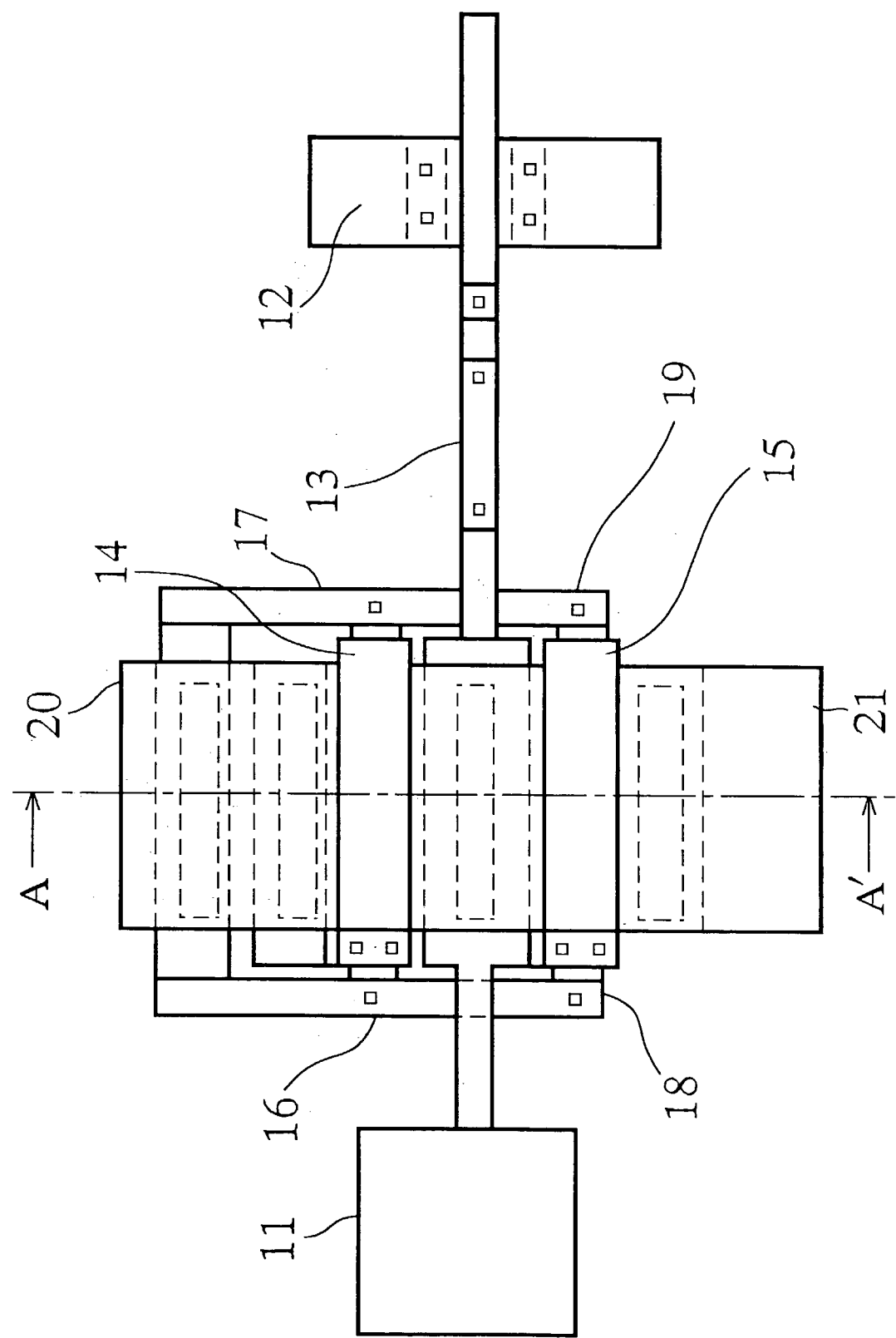
FIG. 2a is a plan view showing a structure of the I/O protective circuit for LCD according to the first embodiment of the invention, corresponding to the circuit as shown in FIG. 1.
Figure 2B:
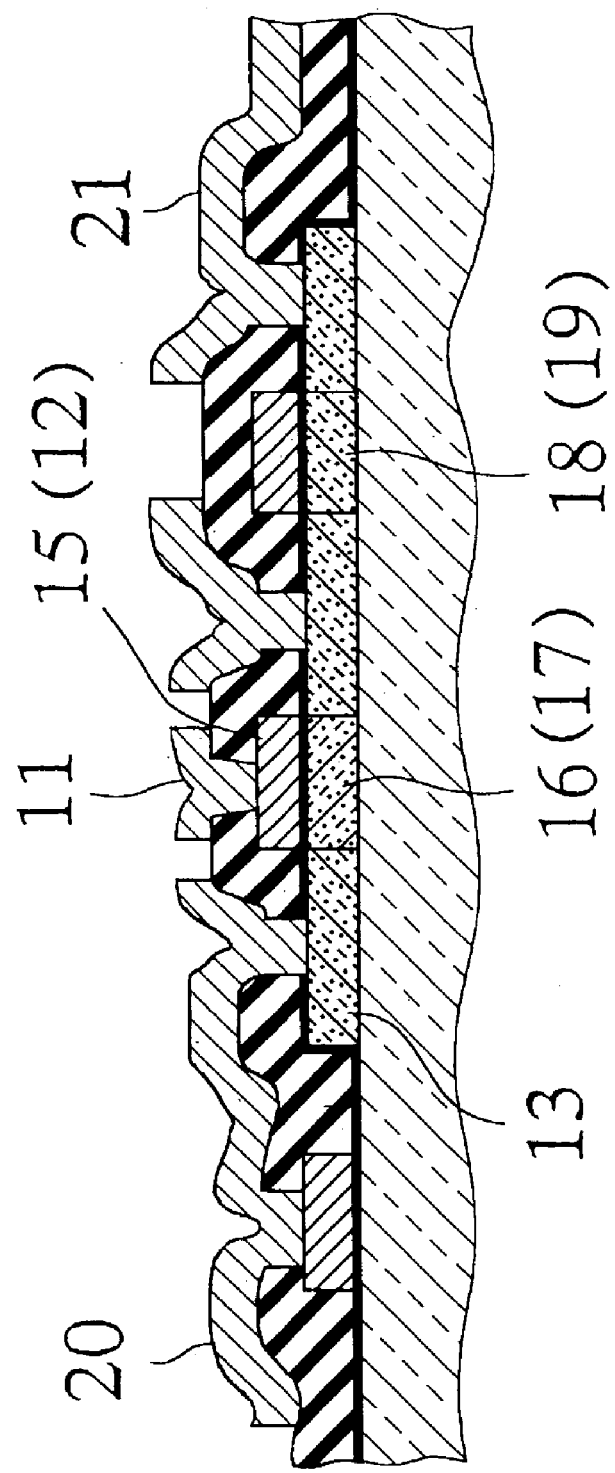

FIG. 1 is a circuit diagram of an input-output (I/O) protective circuit for LCD according to the first embodiment of the invention, FIG. 2a is a plan view showing a structure of the I/O protective circuit for LCD according to the first embodiment of the invention, corresponding to the circuit as shown in FIG. 1, and FIG. 2b is a sectional view taken on line A–A' in FIG. 2a.

In FIGS. 1, 2a and 2b, a reference numeral 11 indicates an I/O terminal pad, 12 an I/O primary stage TFT, 13 an I/O protective resistance, 14 and 15 an I/O protective TFT, 16 an n-type substrate potential fixing terminal connected with the channel layer of the I/O protective TFT 14, in other words, a metal electrode terminal which fixes the potential of an n-type substrate (i.e. channel layer) and is connected with an n-type impurity doped region provided so as to be connected with the channel layer, similar to the above, 17 a p-type substrate potential fixing terminal connected with the channel layer of the I/O protective TFT 14, 18 an n-type substrate potential fixing terminal connected with the channel layer of the I/O protective TFT 15, 19 a p-type substrate potential fixing terminal connected with the channel layer of the I/O protective TFT 15, 20 a ground terminal (earth terminal), and 21 a power source.

As the circuit constitution after the I/O primary stage TFT 12 is publicly known well, it is omitted to show it by means of an illustration and others.

The resistance 13 (300 Ω□ 2.0 KΩ) is provided between the I/O terminal pad 11 and the I/O primary stage TFT 12, the resistances 13 being made in the form of a diffusion layer for instance a layer similar to an n-type high impurity density layer used for forming source and drain regions. The number of resistance 13 is not limited to only one. Two or more resistances may be prepared, for instance between a joint portion at which the wiring connecting the I/O terminal 11 with the resistance joins to two I/O protective TFT's, and the I/O terminal pad 11. With introduction of this resistance 13, the surge current can be guided to the I/O protective circuit before it flows into the I/O primary stage TFT 12 forming a part of the I/O circuit and also flows into the I/O circuit related to the I/O primary stage 12, thereby making the response characteristic inferior, for instance by making the response speed slow.

Two I/O protective TFT's 14 and 15 are connected between the resistance 13 and the I/O terminal 11. The breakdown voltage BVds and the hold voltage in the snap-back characteristic of these I/O protective TFT's 14 and 15 are set to be lower than those of the I/O primary stage TFT 12 (or the before-mentioned TFT as a switching element for driving the pixel of the LCD. This means that the I/O protective circuit is set such that it can begin its operation before the above-mentioned I/O protective circuit enters its on-operation state. The gate width of the I/O protective TFT's 14, 15 is made larger than that of the I/O primary stage TFT 12 in order to prevent the destruction of the I/O protective TFT's 14, 15 by a large surge current. The gate width is determined by the magnitude of the power supply, the preferable width is 100 μm or more.

The I/O protective TFT 14 is an I/O protective TFT against the noise surge on the plus side and its source is connected with the ground terminal 20 as shown in FIG. 1. The channel layer of the I/O protective TFT 14 is connected with the n- and p-type substrate potential fixing terminals 16, 17. That is, as shown in FIG. 2a, these n- and the p-type substrate potential fixing terminals 16, 17 are made of a metal electrode electrically connected with the n- and the p-type impurity doped regions, both of which are provided in a region connected with the channel layer of the I/O protective TFT 14.

The I/O protective TFT 15 is an I/O protective TFT against the noise surge on the minus side and its source is connected with the terminal 21 of the power source (Vdd). The channel layer of the I/O protective TFT 15 is connected with the n- and p-type substrate potential fixing terminals 18, 19. That is, as shown in FIG. 2a, the n- and p-type substrate potential fixing terminals 18, 19 are constituted by a metal electrode electrically connected with the n- and p-type impurity doped region, both of which are provided in a region connected with the channel layer of the I/O protective TFT 15.

The I/O terminal pad 11 is made up of an upper layer and a lower layer and is made of a metal for instance titanium (Ti) for the upper layer and aluminum (Al) for the lower layer. The order of the metal layers may be reversed, that is, Al for the upper layer and Ti for the lower layer.

The I/O primary stage TFT 21 has a gate electrode made of a metal for instance MoW, Al and so for forth, a source and a drain of which each is made in the form of an n-type semiconductor layer made of silicon. The above semiconductor layer including the source and the drain is electrically separated from the gate electrode by an insulating film while the source and the drain are connected with a metal film such as an Al film through corresponding contact holes.

The resistance 13 is made in the form of an n-type silicon layer, but it may be made in the form of a p-type silicon layer and other material.

I/O protective TFT's 14, 15 are similar to the I/O primary stage TFT 21 as far as the structure of their gate, source and drain are concerned. In case of the I/O protective TFT 14, however, the n- and p-type substrate potential fixing terminals 16 and 17 are connected with an intrinsic semiconductor layers (I-layer) under the gate electrode. Similarly, in case of the I/O protective TFT 15, the n- and p-type substrate potential fixing terminals 18, 19 are connected with an intrinsic semiconductor layers (I-layer) under the gate electrode. These substrate potential fixing terminals 16, 17, 18 and 19 are put together by a wiring made of a gate electrode material and connected with the ground terminal 20 in a lump through a contact hole.

As described above, in the I/O protective TFT 14, the substrate (i.e. channel layer) potential of it is fixed by n- and p-type substrate potential fixing terminals 16, 17 while in the I/O protective TFT 15, the substrate potential of it is fixed by n- and p-type substrate potential fixing terminals 18, 19.

The characteristic of the I/O protective TFT's 14 and 15 can be stabilized by these n- and p-type substrate potential fixing terminals 16, 17 and n- and p-type substrate potential fixing terminals 18, 19. Furthermore, even though the surge current takes place, as it flows into these n- and p-type substrate potential fixing terminals 16, 17 and n- and p-type substrate potential fixing terminals 18, 19, the I/O protective TFT's 14, 15 are prevented from being destroyed by one attack of the surge current.

In case of the ordinary TFT, it is difficult to evaluate the characteristic of it separately in the vertical direction and in the lateral direction unless the boundary level and the bulk level are permitted to think of them as completely independent level. As described above, according to the invention, the I/O protective TFT 14 is provided with one each of substrate potential fixing terminals of the n- and p-type 16 and 17 and, similarly, the I/O protective TFT 15 is provided with one each of substrate potential fixing terminals of the n- and p-type 18 and 19. With provision of the above potential fixing terminals, I/O protective TFT's 14, 15 come to show the same effect as is obtainable if a PIN diode is provided in the lateral direction of n-type (or p-type) TFT's 14, 15. In other words, each of I/O protective TFT's 14, 15 comes to have a 5-terminal structure including the above two potential fixing terminals and three terminals for the gate, source and drain. Thus, it becomes possible to independently to evaluate the characteristic of the I/O protective TFT's 14, 15 in the vertical direction as well as in the lateral direction, that is, in the longitudinal direction of the PIN diode.

As described above, the I/O protective circuit according to the first embodiment includes I/O protective TFT's 14, 15 having p-type substrate potential fixing terminals 17, 19 and n-type substrate potential fixing terminals 16, 18 both of which are connected with the channel layer of the I/O protective TFT 14, 15, wherein p-type substrate potential fixing terminals 17, 19 and n-type substrate potential fixing terminals 16, 18 are connected with a ground terminal 20 (corres. to claim 1).

Furthermore, an I/O protective circuit according to the first embodiment includes a resistance 13 provided between an I/O terminal pad 11 and an I/O primary stage TFT12, a wiring connecting the I/O terminal pad 11 with the resistance 13, and two I/O protective TFT's 14, 15 connected in series between a ground terminal 20 and a power source terminal 21, wherein the wiring is connected with the joint portion of the two I/O protective thin film transistors 14, 15, each of two I/O protective TFT's 14, 15 has p-type substrate potential fixing terminals 17, 19 and n-type substrate potential fixing terminals 16, 18, both of which are connected with the channel layer of the I/O protective TFT, and p-type substrate potential fixing terminals 17, 19 and n-type substrate potential fixing terminals 16, 18 are connected with the ground terminal 20 (corres. to claim 2).

Still further, in an I/O protective circuit according to the first embodiment, the breakdown voltage and the hold voltage of the I/O protective TFT's 14, 15 are respectively made lower than those of the I/O primary stage TFT 12 or those of the TFT used as a switching element for driving the pixel of the LCD (corres. to claim 4).

Second Embodiment

Figure 3:
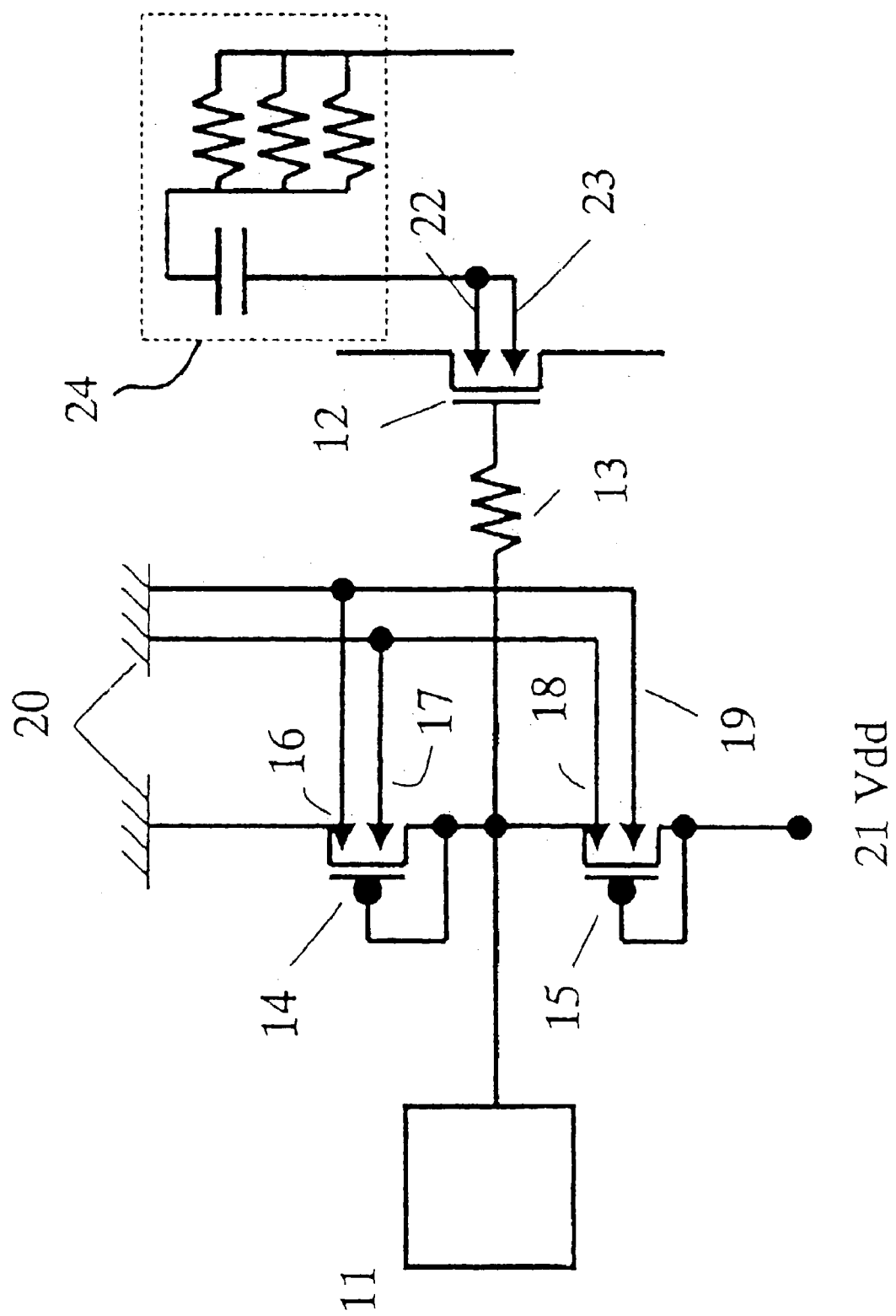
FIG. 3 is an input-output (I/O) protective circuit for LCD according to the second embodiment of the invention.
Figure 4A:
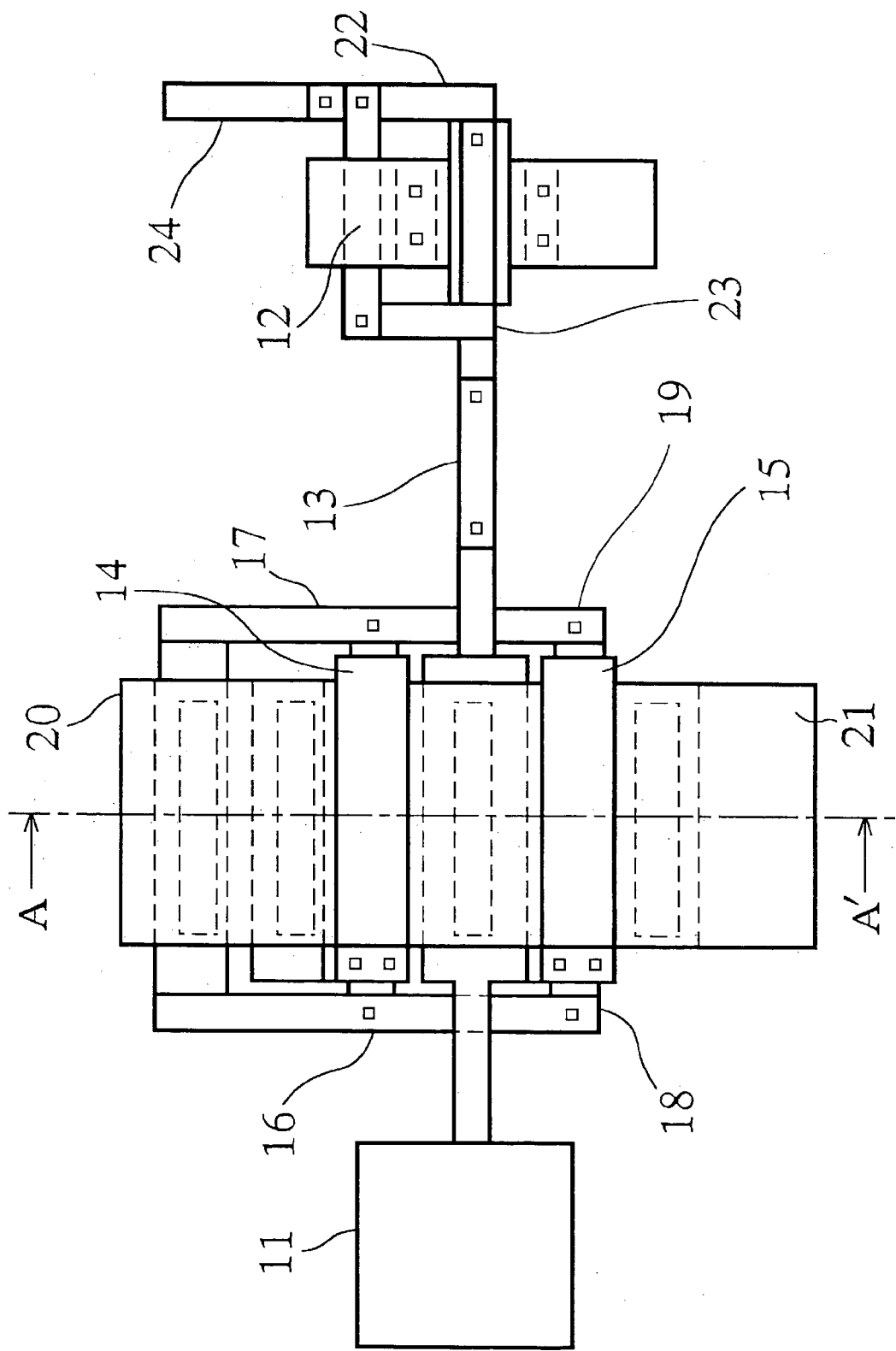
FIG. 4a is a plan view corresponding to the circuit as shown in FIG. 3, that is, the I/O protective circuit for LCD according to the second embodiment of the invention.
Figure 4:
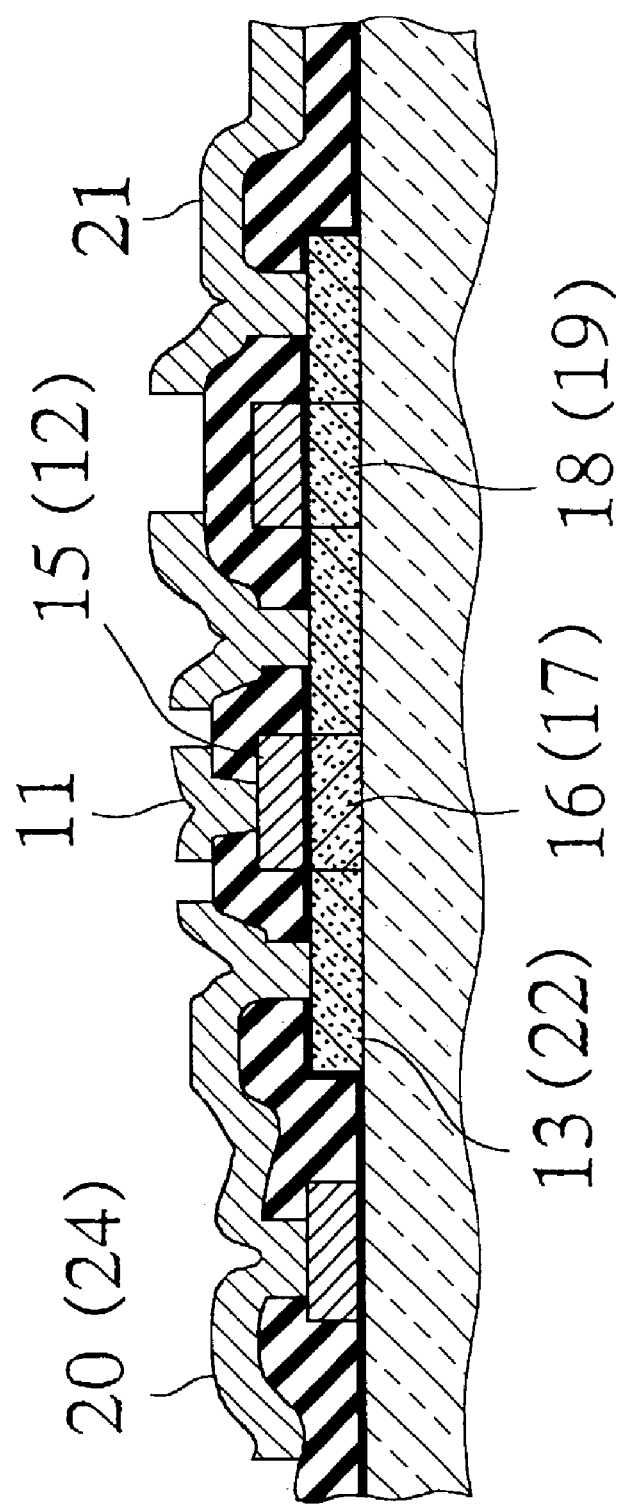
Figure 5:
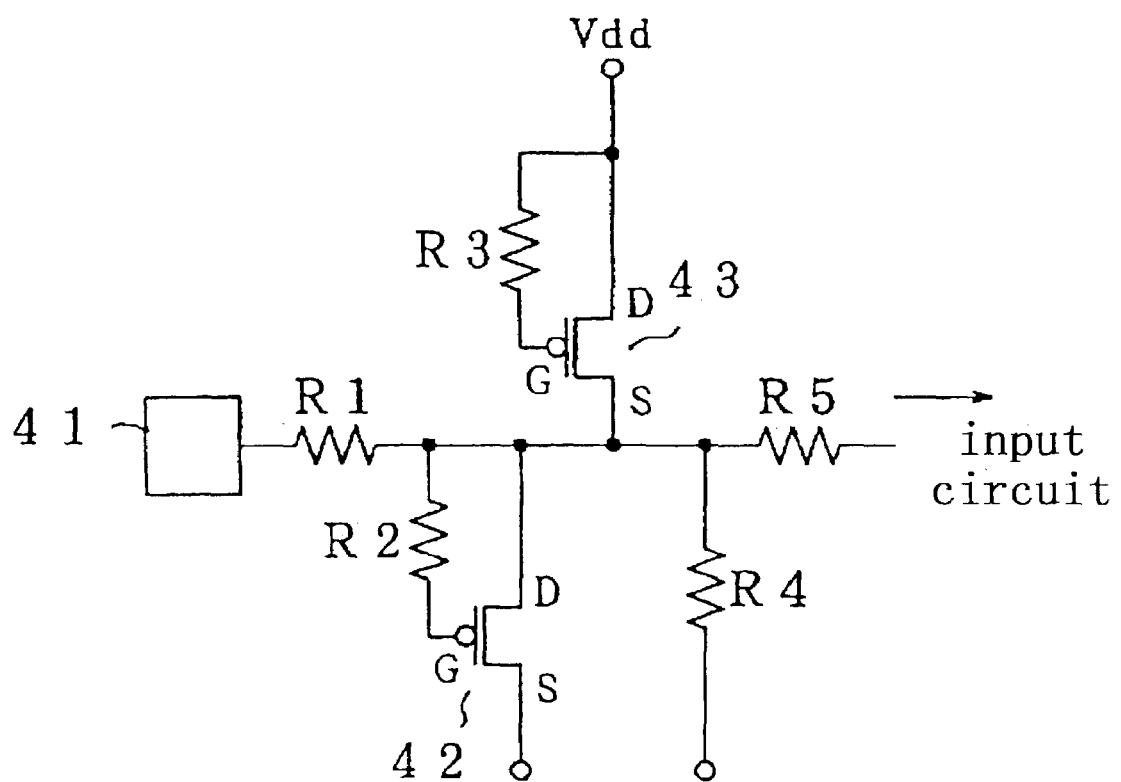
FIG. 5 is an equivalent circuit diagram of the prior art I/O protective circuit for LCD.
Figure 6:
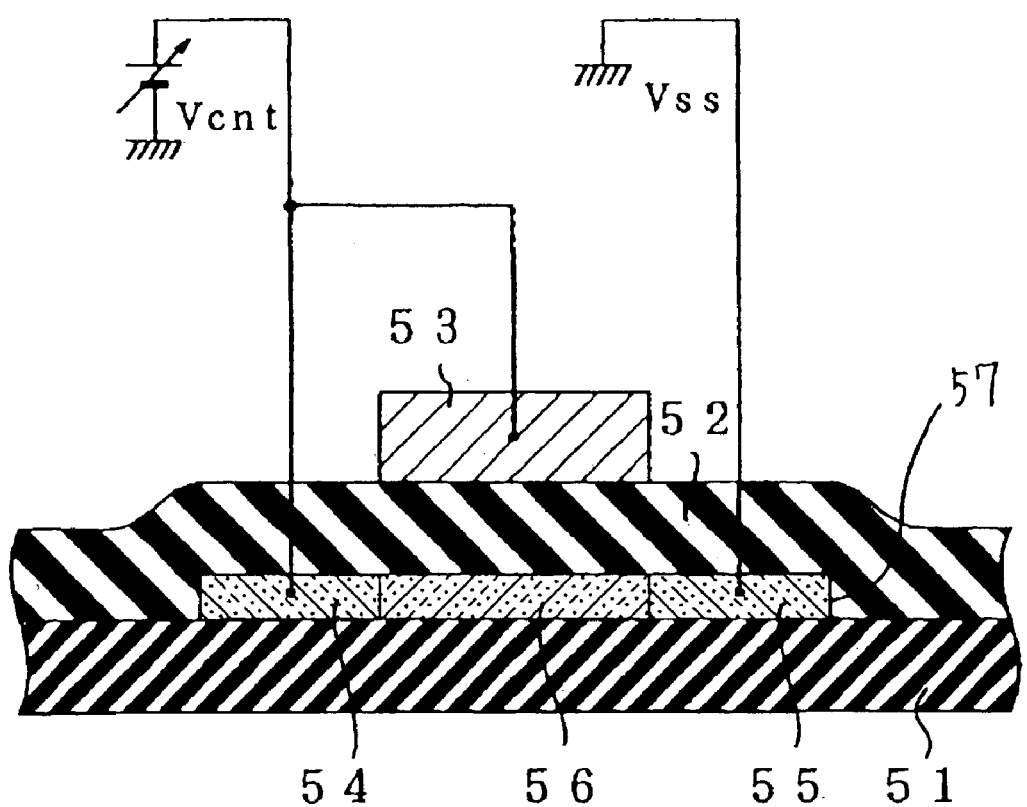
FIG. 6 is a diagram showing an electrical connection between respective electrodes as used in a method of measuring the snapback characteristic of a MOS TFT.
Figure 7:
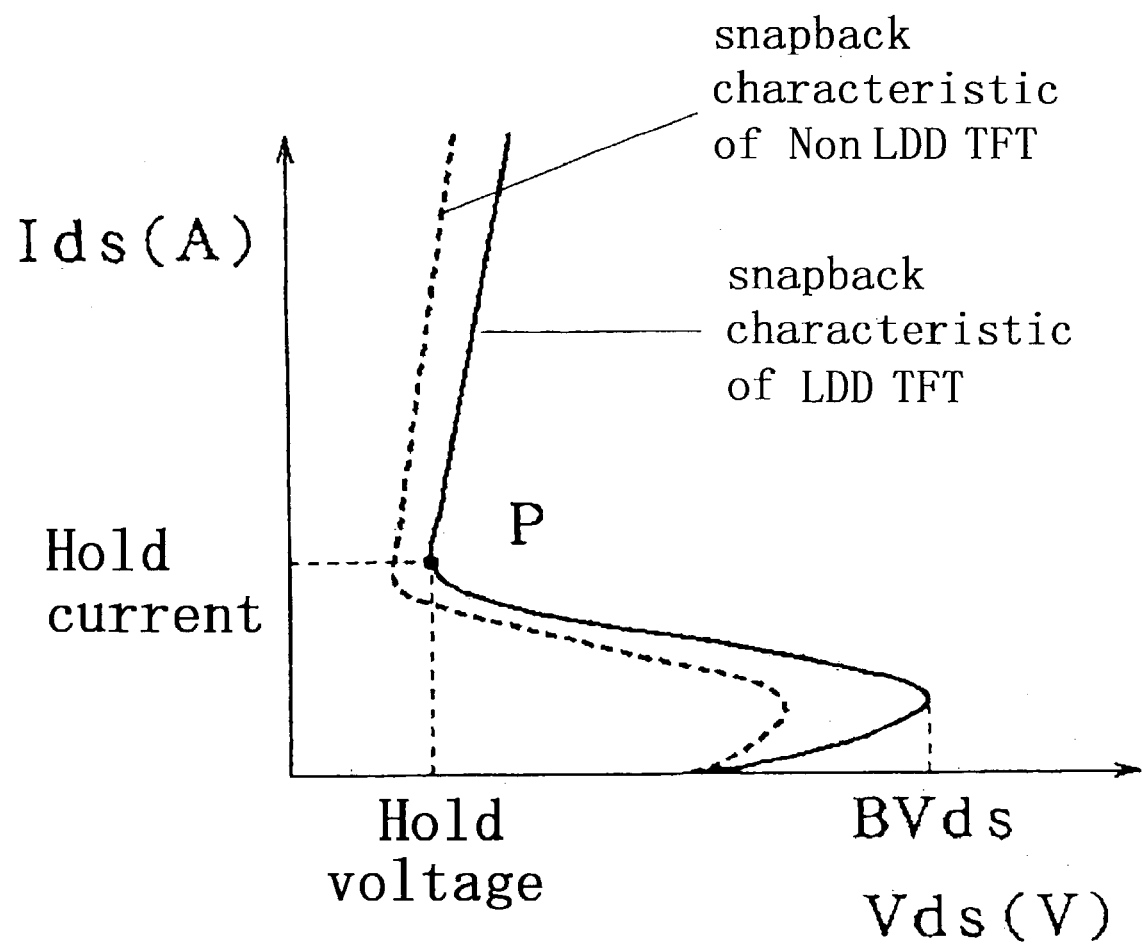
FIG. 7 is a graph showing the snapback characteristic of a MOS TFT.

FIG. 3 is a circuit diagram of an I/O protective circuit for LCD according to the second embodiment of the invention, and FIG. 4a is a plan view showing a structure of the I/O protective circuit for LCD according to the second embodiment of the invention, corresponding to the circuit as shown in FIG. 3, FIG. 4b is a sectional view taken on line A–A' in FIG. 4a.

In FIGS. 3, 4a and 4b, a reference numeral 22 indicates an n-type substrate potential fixing terminal connected with the channel layer of an I/O primary stage TFT 12, in other words, a metal electrode terminal which fixes the potential of an n-type substrate (i.e. channel layer) and is connected with an n-type impurity doped region provided so as to be connected with the channel layer, similar to the above, 23 a p-type substrate potential fixing terminal connected with the channel layer of the I/O primary stage protective TFT 12, and 24 a substrate bias generation circuit (substrate potential generation circuit, substrate bias correction circuit) which is connected with n- and p-type substrate potential fixing terminals 22, 23 connected with the I/O primary stage TFT 12.

As the first embodiment as shown in FIGS. 1, 2a, 2b and the second embodiment as shown in FIGS. 3, 4a, 4b have the same structure with regard to the circuit from the I/O terminal pad 11 up to the ground terminal 20 with which the I/O protective circuit is connected, the description thereabout will be omitted In FIGS. 3, 4a and 4b, an I/O primary stage TFT 12 is connected with n- and p-type substrate potential fixing terminals 22, 23, which are connected with a substrate bias generation circuit 24 applying a predetermined voltage to the above substrate potential fixing terminals 22 and 23. I/O protective TFT's 14, 15 are able to stably operates by setting the breakdown voltage BVds of the I/O primary stage TFT 12 to be higher than that of the I/O protective TFT's 14, 15. As shown in FIG. 3, the substrate bias generation circuit 24 includes a resistance made of a fuse and others before a capacitance and is able to adjust the substrate potential of the I/O primary stage TFT 12.

As described above, according to the second embodiment, the electrical instability of the I/O protective TFT's 14, 15 due to the unfixed substrate potential thereof can be obviated by providing n-type substrate potential fixing terminal 16, 18 and p-type substrate potential fixing terminal 17, 19, and also the I/O protective TFT's 14, 15 is prevented from being destroyed by the one attack of the surge noise current flowing into not only the source side but the substrate side.

In the second embodiment, the channel layer of the I/O primary stage TFT 12 is connected with the n- and p-type substrate potential fixing terminals 22, 23. The substrate bias generation circuit 24 applies an adjusted substrate potential to the I/O primary stage TFT 12 such that the breakdown voltage BVds of the I/O primary stage TFT 12 is always kept larger than that of the I/O protective circuit.

Accordingly, similar to the first embodiment, as the I/O protective TFT's 14, 15 and the I/O primary stage TFT 12 are provided with the n-type substrate potential fixing terminals 16, 18, 22 and the p-type substrate potential fixing terminals 17, 19, 23, the I/O protective TFT's 14, 15 and the I/O primary stage TFT 12 come to show the same effect as is obtainable if a PIN diode is provided in the respective lateral direction of them. In other words, each of I/O protective TFT's 14, 15 and the I/O primary stage TFT 12 comes to have a 5-terminal structure including the above two potential fixing terminals and three terminals for the gate, source and drain. Thus, it becomes possible to independently evaluate each characteristic of the I/O protective TFT's 14, 15 and the I/O primary stage TFT 12 in the vertical direction as well as in the lateral direction, that is, in the longitudinal direction of the PIN diode.

As described above, an I/O protective circuit for LCD including the I/O primary stage TFT 12 having the n-type substrate potential fixing terminal 22 and the p-type substrate potential fixing terminal 23 both of which are connected with the channel layer of the I/O primary stage TFT 12 as well as with the substrate bias generation circuit 24.

While some embodiments of the invention have been concretely shown and described in the above with reference to the accompanying drawings, the invention is not limited to such embodiments. Various changes and modifications will be possible without departing from the gist of the invention.

As has been described so far, according to the invention, it becomes possible to provide an I/O protective circuit for LCD, having more stable I/O protective function.

What is claimed is:

1. An input-output (I/O) protective circuit for use in a liquid crystal display having a I/O primary stage thin film transistor comprising:
    an I/O protective thin film transistor operatively coupled to the I/O primary stage thin film transistor and having a p-type substrate potential fixing terminal and an n-type substrate potential fixing terminal, both of which are operatively coupled to a channel layer of the I/O protective thin film transistor,
    wherein both p-type and n-type substrate potential fixing terminals are connected to a ground terminal, and wherein a breakdown voltage and a hold voltage of the I/O protective thin film transistor are made, respectively, lower than those of the I/O primary stage thin film transistor or those of a thin film transistor used as a switching element for driving a pixel of the liquid crystal display device.

2. An I/O protective circuit for use in a liquid crystal display device having an I/O primary stage thin film transistor comprising:
    a resistance provided between an I/O terminal pad and the I/O primary stage thin film transistor;
    a wiring connecting the I/O terminal pad to the resistance; and
    a first and a second I/O protective thin film transistors coupled in series between a ground terminal and a power source terminal, each I/O protective thin film transistor comprising a p-type substrate potential fixing terminal and an n-type substrate potential fixing terminal, both of which are operatively coupled to a channel layer of the I/O protective thin film transistor wherein the wiring is connected with each joint portion of the first and the second I/O protective thin film transistors, wherein said p-type and n-type substrate potentials fixing terminals are connected to the ground terminal, and wherein a breakdown voltage and a hold voltage of the I/O protective thin film transistors are made, respectively, lower than those of the I/O primary stage thin film transistor or those of a thin film transistor used as a switching element for driving a pixel of the liquid crystal display device.

3. The circuit of claim 2, wherein the I/O primary stage thin film transistor comprises a p-type substrate potential fixing terminal and an n-type substrate potential fixing terminal, both of which are connected to a substrate bias generation circuit.

4. The circuit of claim 3, wherein the p-type substrate potential fixing terminal and the n-type substrate potential fixing terminal are in a channel layer of the I/O primary stage thin film transistor.

5. A protective circuit for use in a liquid crystal display device connectable to an input circuit of a primary stage thin film transistor comprising:
   a protective thin film transistor comprising a p-type substrate potential fixing terminal and an n-type substrate potential fixing terminal operatively coupled to a channel layer; and
   a ground terminal operatively coupled to the p-type and n-type substrate potential fixing terminals,
   wherein a breakdown voltage and a hold voltage of the protective thin film transistor are made, respectively, lower than a breakdown voltage and a hold voltage of the primary stage thin film transistor or lower than a breakdown voltage and a hold voltage of a thin film transistor used as a switching element for driving a pixel of the liquid crystal display device.

6. The protective circuit of claim 5 wherein the operative coupling of the p-type and n-type substrate potential fixing terminals occurs in the channel layer.

7. The protective circuit of claim 6, wherein a breakdown voltage and a hold voltage of the protective thin film transistor are made, respectively, lower than a breakdown voltage and a hold voltage of the primary stage thin film transistor or lower than a breakdown voltage and a hold voltage of a thin film transistor used as a switching element for driving a pixel of the liquid crystal display device.

8. The protective circuit of claim 5, wherein the width of a gate of the protective thin film transistor is about 100 μm or more.

9. The protective circuit of claim 5, wherein the width of a gate of the protective thin film transistor is greater than the width of a gate of the primary stage thin film transistor.

10. The protective circuit of claim 5, wherein the primary stage thin film transistor has a p-type substrate potential fixing terminal and an n-type substrate potential fixing terminal operatively coupled to a channel layer and are operatively coupled to a substrate bias generation circuit.

11. A protective circuit for use in a liquid crystal display device connectable to an input circuit of a primary stage thin film transistor comprising:
   a first protective thin film transistor comprising a p-type substrate potential fixing terminal and an n-type substrate potential fixing terminal operatively coupled to a channel layer on a positive side of the circuit;
   a second protective thin film transistor comprising a p-type substrate potential fixing terminal and an n-type substrate potential fixing terminal operatively coupled to a channel layer on a positive side of the circuit; and
   a ground terminal operatively coupling the p-type and the n-type substrate potential fixing terminals of the first and the second protective thin film transistors,
   wherein a breakdown voltage and a hold voltage of the protective thin film transistor are made, respectively, lower than those of the primary stage thin film transistor or those of a thin film transistor used as a switching element for driving a pixel of the liquid crystal display device.

12. The protective circuit of claim 11, wherein the width of a gate of at least one protective thin film transistor is greater than the width of a gate of the primary stage thin film transistor.

13. The protective circuit of claim 11, wherein the width of a gate of at least one protective thin film transistor is about 100 μm or more.

14. The circuit of claim 11, wherein the primary stage thin film transistor comprises a p-type substrate potential fixing terminal and an n-type substrate potential fixing terminal, both of which are operatively coupled to a substrate bias generation circuit.

* * * * *